United States Patent
Kim et al.

(10) Patent No.: US 8,241,961 B2
(45) Date of Patent: Aug. 14, 2012

(54) METHOD FOR MANUFACTURING HETERO-BONDED WAFER

(75) Inventors: Young Hae Kim, Daejeon (KR); Sang Hwan Lee, Daejeon (KR)

(73) Assignee: Young Hae Kim, Daejeon (KR)

(*) Notice: Subject to any disclaimer, the term of this patent is extended or adjusted under 35 U.S.C. 154(b) by 161 days.

(21) Appl. No.: 12/796,798

(22) Filed: Jun. 9, 2010

(65) Prior Publication Data

US 2010/0308455 A1   Dec. 9, 2010

(30) Foreign Application Priority Data

Jun. 9, 2009  (KR) .................. 10-2009-0050859

(51) Int. Cl.
  *H01L 21/58*  (2006.01)
  *H01L 21/78*  (2006.01)
(52) U.S. Cl. ....................................... 438/118; 438/459
(58) Field of Classification Search .............. 438/118, 438/459; 148/DIG. 12; 257/E21.511, E21.569
See application file for complete search history.

(56) References Cited

U.S. PATENT DOCUMENTS

| | | | | |
|---|---|---|---|---|
| 6,114,191 A | * | 9/2000 | Young et al. | 438/125 |
| 7,227,213 B2 | * | 6/2007 | Mastromatteo et al. | 257/304 |
| 2003/0222354 A1 | * | 12/2003 | Mastromatteo et al. | 257/774 |
| 2006/0252229 A1 | * | 11/2006 | Joly et al. | 438/455 |
| 2007/0249144 A1 | * | 10/2007 | Cheng et al. | 438/459 |
| 2008/0187757 A1 | | 8/2008 | Tong | |
| 2009/0267083 A1 | | 10/2009 | Cui | |
| 2010/0308455 A1 | * | 12/2010 | Kim et al. | 257/734 |

OTHER PUBLICATIONS

Alexe, et al., "Low temperature GaAs/Si direct wafer bonding", Electronics Letters, Mar. 30, 2000, 36(7):677-678.
Eda, et al., "Novel Composite Piezoelectric Materials Using Direct Bonding Techniques", 1995 IEEE Ultrasonics Symposium Proceedings, Nov. 7-10, 1995, 2:921-924.
Gabriel, et al., "Wafer direct bonding with ambient pressure plasma activation", Microsyst Technol, 2006, 12(5):397-400.
Gösele, et al., "III-V Materials Integration Technologies: Wafer Bonding Approaches", 2000 International Conference on Indium Phosphide and Related Materials, Conference Proceedings, 2000, pp. 9-12.
Gösele, et al., "Wafer Bonding for Materials Integration", Compound Semiconductor, Sep./Oct. 2000, 6(7):76-82.

(Continued)

*Primary Examiner* — George Fourson, III
(74) *Attorney, Agent, or Firm* — Drinker Biddle & Reath LLP

(57) ABSTRACT

A method for manufacturing a hetero-bonded wafer having a large mismatch of thermal expansion coefficient comprises forming a wafer bonding means and an electrical interconnection means on at least one bonding surface of two wafers to be bonded with each other, forming grooves in the bonding surface of one wafer along dicing lines with an interval between the grooves being equal to or an even multiple of a die width, bonding the two wafers at a temperature less than 200° C., thinning a back side of the grooved wafer such that at least a portion of the grooves is exposed, and rebonding the bonded wafer pair at an elevated temperature higher than the first bonding temperature. The method for manufacturing a hetero-bonded wafer can avoid wafer level bow/warp and also reduce debonding and cracking in individual segments induced by thermal stress due to a mismatch of thermal expansion coefficient. Embodiments of the method are useful for wafer level packaging and the fabrication of hybrid devices by heterogeneous wafer bonding.

23 Claims, 6 Drawing Sheets

OTHER PUBLICATIONS

Jimbo, et al., "Hetero-Epitaxy and Material-Bonding for Integrated Multi-Wavelength Photonic Devices", Photonics Based on Wavelength Integration and Manipulation, 2005, pp. 25-38, IPAP Books 2.

Lasky, "Wafer bonding for silicon-on-insulator technologies", Appl Phys Lett, Jan. 6, 1986, 48(1):78-80.

Liang, et al., "150 mm InP-to-Silicon Direct Wafer Bonding for Silicon Photonic Integrated Circuits", 214th Electrochemical Society Meeting (PRiME 2008), Paper 2220, Oct. 17, 2008, 1 page.

Müller, et al., "Tensile strength characterization of low-temperature fusion-bonded silicon wafers", J. Micromech. Microeng., 1991, 1:161-166.

Paniccia, et al., "A Hybrid Silicon Laser: Silicon photonics technology for future tera-scale computing", White Paper Research at Intel, 2006, pp. 1-6, Intel Corporation.

Tong, "Low Temperature Wafer Direct Bonding", Journal of Microelectromechanical Systems, Mar. 1994, 3(1):29-35.

Tong, "Wafer bonding for integrated materials", Materials Science and Engineering, 2001, B87:323-328.

Tracy, et al., "Germanium-on-Insulator Substrates by Wafer Bonding", Journal of Electronic Materials, Nov. 8, 2004, 33(8):886-892.

Xie, et al., "Low-temperature direct wafer bonding of GaAs/InP", Superlattices and Microstructures, 2009, 45:47-53.

* cited by examiner

METHOD FOR MANUFACTURING HETERO-BONDED WAFER

CROSS-REFERENCE TO RELATED APPLICATIONS

This application claims the priority of Korean Patent Application No. 10-2009-0050859, filed Jun. 9, 2009 in the Korean Patent Office, which is incorporated herein by reference in its entirety.

BACKGROUND

1. Field of the Invention

Embodiments generally relate to wafer bonding techniques, and more specifically to a method for manufacturing hetero-bonded wafers for the application of heterogeneous device integration and wafer level packaging.

2. Description of the Related Art

Heterogeneous device integration through the combination of dissimilar materials such as silicon, compound semiconductors, piezoelectric materials, etc., offers the potential to provide versatile functions not available from pure devices alone. One method for heterogeneous device integration has been wafer bonding technology. Wafer bonding techniques readily available today include anodic bonding, thermo-compression boding, eutectic bonding, diffusion bonding, and solder bonding. These conventional wafer bonding techniques require high bonding temperatures ranging from 200° C. to 400° C. Bonding of dissimilar materials having different thermal expansion coefficients (TEC) at such a high temperature gives rise to thermal stresses and strains that lead to defect generation, debonding, bow/warp and cracking.

Wafer bonding techniques are also used for wafer level packaging (WLP). In WLP, silicon is most commonly used as a cap or encapsulation material due to the advanced processing technologies and good mechanical properties. Many kinds of silicon based devices such as accelerometers, FBAR (film bulk acoustic resonator), CMOS image sensors, fluidic devices, and pressure sensors have successfully adopted WLP technology using silicon cap wafer bonding. But, non-silicon based devices made of compound semiconductors and piezoelectric materials have not been successful using silicon cap wafer bonding due to TEC mismatch problems. For instance, Lithium niobate (LiNbO$_3$) and Lithium tantalite (LiTaO$_3$), commonly used for surface acoustic wave (SAW) filter fabrication, have several times larger TEC than silicon or LTCC, thus wafer bonding of silicon and piezoelectric materials has significant thermal stress problems. Therefore, development of a heterogeneous wafer bonding method especially having a large TEC mismatch is very useful for both heterogeneous device integration and WLP.

Room temperature wafer bonding techniques are developed to solve the thermo mechanical stress problems between dissimilar materials. Direct bonding or fusion bonding is a typical example of room temperature wafer bonding techniques. (Reference; J. B. Lasky, "Wafer bonding for silicon-on insulator technologies" Appl. Phys. Lett. 48 (1986) 78., and U. Gösele, M. Alexe, and Q-Y-Tong, "Wafer bonding for materials integration" Compound Semiconductor 6(7) September/October 2000). Direct wafer bonding is a technology that allows wafers to be bonded at room temperature without using any adhesive materials. The bonding strength of direct bonding is relatively weak, therefore the bonded wafer pair usually have to undergo a heat treatment at high temperature for more than several hours to increase the bond strength across the bonding interface. However, serious thermal stress imposed by subsequent heat treatment limits the allowed temperature range and obtainable bond strength.

Attempts to improve the bond strength of the room temperature bonding have been performed by various methods such as wet chemical pre-treatment and high speed ion plasma treatment of bonding surface (Reference; B. Muller, et al, "Tensile strength characterization of low-temperature fusion bonded silicon wafers" J. Micromech, Microeng. I (1991) 161-166, and Q-Y-Tong, et al, "Low temperature wafer direct bonding", J. Microelectromech. Sys. 3 (1994) 29, and M. Gabriel, B. Johnson, R. Suss, M, Reiche, M. Eichler, "Wafer direct bonding with ambient pressure plasma activation", Microsyst Technol (2006) 12: 397-400). Surface activated bonding (SAB) was most successful among them by using the method of impinging fast ion beams of Ar, O$_2$, or N$_2$ plasma in very high vacuum to the bonding surfaces to remove oxide on the surfaces. The SAB has been known useful between various materials such as semiconductor-semiconductor, metal-metal, metal-ceramic, and semiconductor-metal. However, one drawback of the SAB is high cost of manufacturing due to the high vacuum level of about 1×10$^{-6}$ Torr or above.

Although room temperature direct bonding techniques are potentially promising to solve the thermal stress issues for heterogeneous wafer bonding, it has several intrinsic obstacles hard to be overcome. For example, surface cleanness and smoothness are very critical for successful direct bonding, but practically such conditions are hardly to be met in the case of processed wafers having a variety of devices and surface conditions. In addition to the surface conditions, bonding of processed wafers may further require electrical interconnections between devices or circuits carried in the bonding wafers for their functional integration. Therefore, contact pads or solder bumps are required but can produce a significant surface topology problem.

Instead of the wafer bonding method, another approach for heterogeneous device integration of dissimilar materials has been die(or chip)-to-wafer bonding method. In die-to-wafer bonding scheme, the area of bond interface is very small compared to wafer-to-wafer bonding, and the dies and a host wafer are free to expand or contract in lateral directions. Thus wafer scale bow and warp is avoided because the thermo-mechanical stress is confined within the die level. Another advantage of the die-to-wafer bonding is that the bonding temperature can be extended to higher temperature than that of the wafer-to-wafer bonding. However, conventional die-to-wafer bonding method needs complicated manufacturing steps, such as singulating dies from a donor wafer, cleaning dies, and bonding each of the dies onto a receiving wafer, and therefore it is not cost effective.

Thermal stresses and strains caused by the mismatch of TEC are an intrinsic property of materials that cannot be completely solved, but wafer level effects such as bow and warp can be eliminated, and debonding and cracking in die level can be reduced by utilizing the advantage of die-to-wafer bonding scheme, but improving the high cost of manufacturing.

SUMMARY

To solve the thermal stress issues in heterogeneous wafer bonding and the high cost of conventional die-to-wafer bonding method, an embodiment of a method for manufacturing a hetero-bonded wafer comprises: i) bonding two dissimilar wafers at low temperature or more preferably at room temperature to avoid thermal stress, ii) fragmenting one of the bonded wafer pair into a plurality of small segments, iii)

rebonding the bonded wafer pair at an elevated temperature to increase the first bonding strength or form a new strong bond between the two bonding wafers.

According to an exemplary embodiment, the method of the wafer fragmentation comprises: i) forming a plurality of grooves in the bonding surface of a first wafer in horizontal and vertical directions along the dicing lines with a depth at least not deeper than the wafer thickness, ii) bonding a second wafer onto the bonding surface of the first wafer at low temperature or more preferably at room temperature, and iii) thinning the back side of the first wafer such that the grooved wafer is fragmented into a plurality of small segments which are still adhered on the second wafer.

The first bonding at low temperature or more preferably at room temperature provides an intermediate joining between two bonding wafers to withstand the subsequent wafer fragmentation process until the rebonding process. The first low-temperature bonding is preferably provided by room temperature bonding methods to avoid thermo-mechanical stresses during or after wafer bonding. However, embodiments do not limit the first bonding temperature merely at around 25° C., but the first bonding temperature can be extended to about 20° C. depending on the amount of TEC mismatch between the two bonding wafers in the cases wherein the thermal stress induced wafer bow/warp and crack is negligible. In this case, low-temperature wafer bonding methods such as adhesive bonding and diffusion bonding also can be applied.

The rebonding process completes the bonding of two wafers by a simple heat treatment or by a formation of new bonds between them. The methods for forming a new bond include anodic bonding, thermo-compression bonding, eutectic bonding, and solder bonding. The maximum rebonding temperature can be limited by the amount of TEC mismatch between the two wafers. Practically, it is kept under the temperature wherein the physical deformation in the segments can be avoided. Depending on the methods of the low-temperature bonding and the rebonding, one or two different kinds of bonding means can be provided only at one wafer or two wafers.

According to an embodiment, a method for providing electrical interconnections between the two bonding wafers comprises providing electrical interconnection means on contact pads of each die contained in the two bonding wafers before the low-temperature wafer bonding process. Electrical interconnections between bonding wafers can be achieved during the low-temperature bonding process and/or rebonding process.

BRIEF DESCRIPTION OF THE DRAWINGS

The above and other features and advantages will become more apparent by describing in detail exemplary embodiments with reference to the attached drawings in which.

DESCRIPTION OF THE PREFERRED EMBODIMENTS

Figure 1:
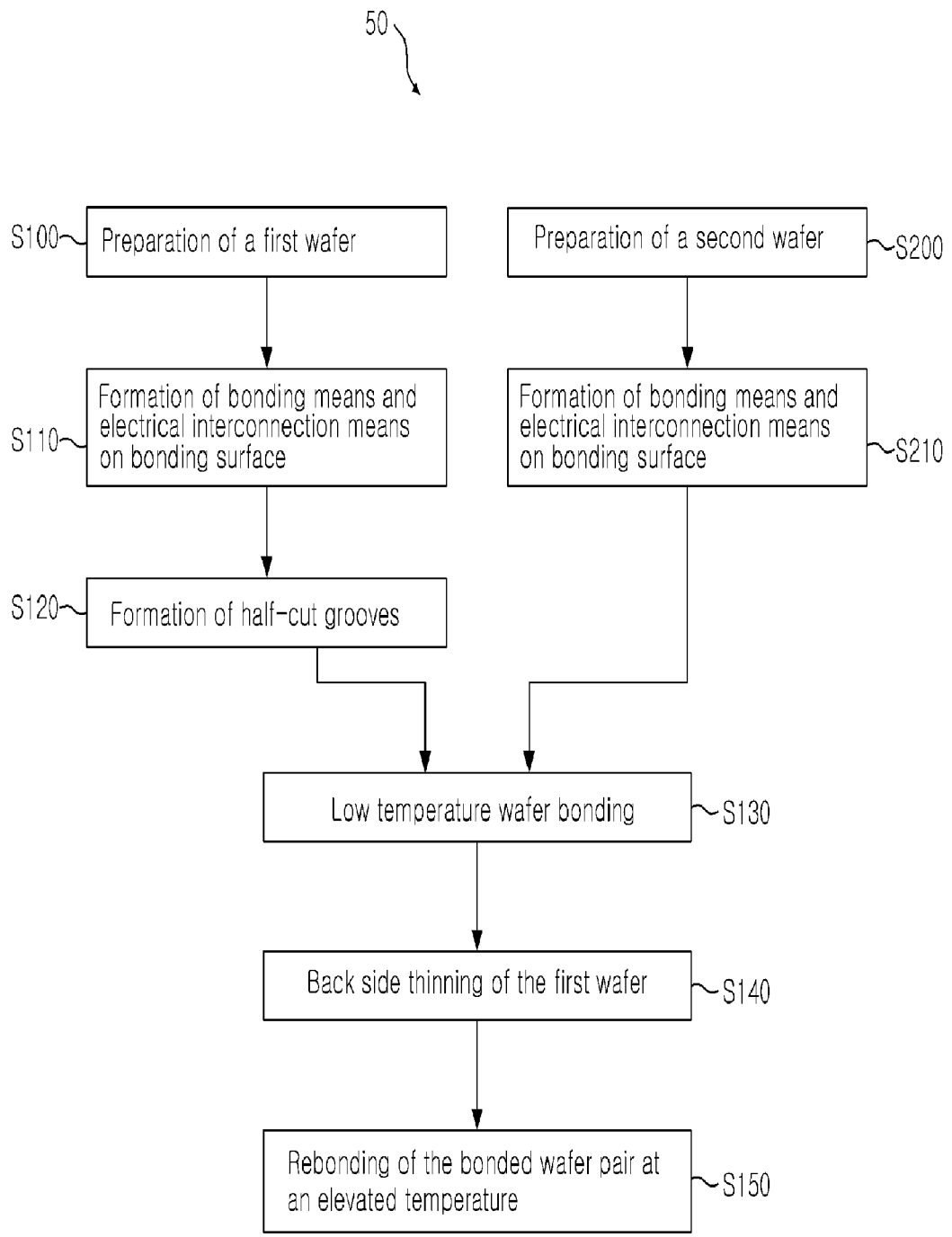
FIG. 1 is a flow diagram illustrating a method for manufacturing a hetero-bonded wafer according to an exemplary embodiment.

Before describing embodiments in detail, it is to be understood that the invention is not limited to specific materials, methods of wafer bonding, and application area of hetero-bonded wafers. The embodiments will be described more in detail hereinafter with reference to the accompanying drawings, in which preferred embodiments of the invention are shown. Furthermore, like reference numerals designate corresponding parts throughout the several views.

FIG. 1 is a flow diagram illustrating a method 50 for manufacturing a hetero-bonded wafer according to an exemplary embodiment. The method comprises: i) step S100 preparation of a first wafer and step S200 preparation of a second wafer to be bonded with each other; ii) step S110 formation of bonding means and electrical interconnection means on the bonding surface of the first wafer, and step S210 formation of bonding means and electrical interconnection means on the bonding surface of the second wafer; iii) step S120 formation of a plurality of grooves in the bonding surface of the first wafer at least shallower than the wafer thickness; iv) step S130 bonding of the first wafer and the second wafer at low temperature with a proper alignment process; v) step S140 thinning of the backside of the first wafer down to at least exposing a portion of the grooves; and vi) step S150 rebonding of the low-temperature bonded wafer pair at an elevated temperature of at least higher than the first bonding temperature.

In the step S100 and S200 of the method 50, the first wafer and the second wafer participating in heterogeneous wafer bonding can be comprised of any dissimilar materials having different TEC. More particularly, substrates of the bonding wafers may be made of silicon, compound semiconductors, glass, ceramics, LTCC, etc. The ceramics may comprise piezoelectric materials such as $LiNbO_3$, $LiTaO_3$, and PZT used as a substrate for the manufacturing of SAW devices. The differentiation of the first wafer and the second wafer may not be definite, but may be inter-changed with each other. Either or both of the first wafer and the second wafer may be processed or un-processed bare wafers. The processed wafers may comprise active or passive devices such as electric devices, mechanical devices, optoelectronic devices, photonic devices, sensors, and bio devices. Furthermore, the processed wafers may be stacked wafers comprising at least two wafers. In the case of both being processed wafers, one may be a device wafer and the other one may be a cap wafer for encapsulating the device wafer by wafer bonding. In this case, the cap wafer is preferably selected as a first wafer in terms of manufacturing convenience. The cap wafers may further comprise cavities, through-wafer vias and passive devices in the bonding surface. Both of the device wafers and cap wafers may further comprise through-wafer vias and metal pads in the opposite side of the bonding surface. For an example, SAW or FBAR device wafers may be bonded to LTCC cap wafers having cavities, through-wafer vias, and metal pads.

In the steps S110 and S210 of the method 50, the bonding means may provide a mechanical joining between two bonding wafers by two steps: bonding step S130 at low temperature or at room temperature, and rebonding step S150 at elevated temperatures at least higher than the low-temperature bonding temperature. In the present embodiment, the term "means" may be understood as pad or pads having a specific shape or shapeless comprised of single or multiple layers of conductive or non-conductive materials. Hereinafter, the wafer bonding process in the step S130 is referred to as a first bonding and the rebonding process in the step S150 is referred to as a second bonding. The provision of wafer bonding means is directly related to the methods of the first bonding and the second bonding. A method of the first bonding may include direct bonding between wafer surfaces or metals, adhesive bonding, and diffusion bonding between metals, metal and solder, or solders. For the second bonding, more versatile techniques may be applied such as annealing, diffusion bonding, thermo compression bonding, eutectic bonding, solder bonding, and anodic bonding. The first bonding and the second bonding may be provided by one bonding means or by two different bonding means depending on the bonding methods. When the first bonding is provided by direct bonding and diffusion bonding, the second bonding process may be a simple heat treatment at an elevated temperature to improve the first bonding strength without additional rebonding means. A separate bonding means may be provided for the second bonding to form a new strong bond between the two bonding wafers independent to the first bonding methods. In this case hereinafter, a bonding means for the first bonding is referred to as a first bonding means and the other bonding means for the second bonding is referred to as a second bonding means.

The electrical interconnection means may provide low resistance electrical interconnections between active or passive devices that are contained in two processed wafers. If the two bonding wafers are un-processed wafers, the electrical interconnection means may be skipped. The formation of bonding means and electrical interconnection means on one wafer may be skipped in accordance with the methods of wafer bonding and electrical interconnection.

Hereinafter, several embodiments of methods of comprising bonding means and electrical interconnection means are described next with reference to FIG. 2 through FIG. 6.

Figure 2:
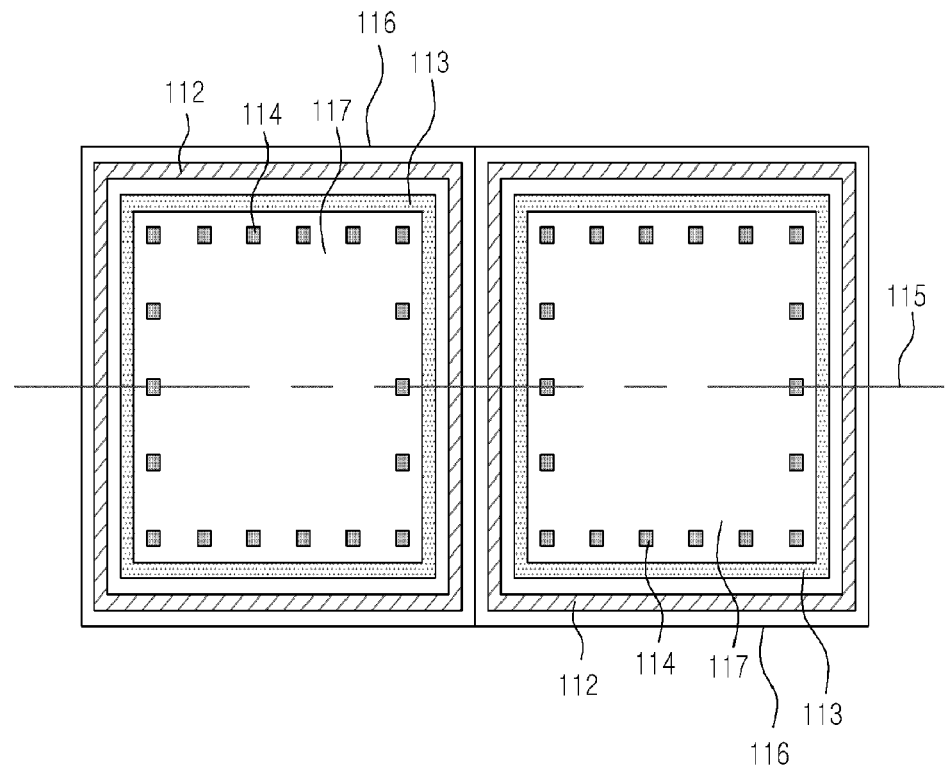
FIG. 2 is a top planar view illustrating a portion of a first wafer, wherein a first bonding means, a second bonding means, and electrical interconnection means are formed according to an exemplary embodiment.
Figure 3:
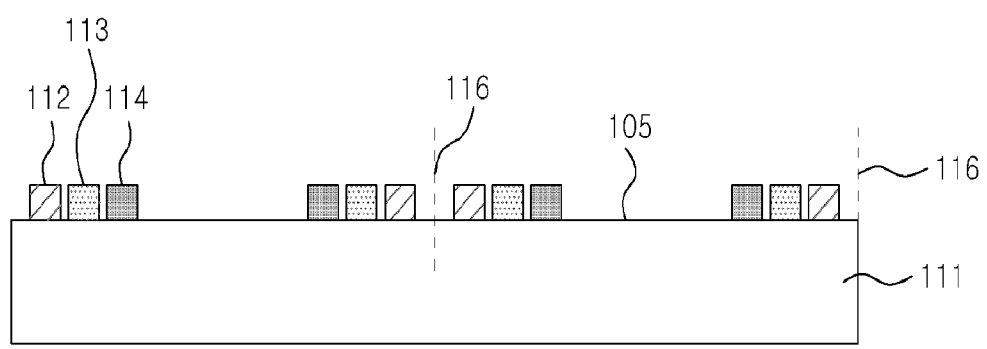
FIG. 3 is a cross-sectional view according to a cut across line 115 in FIG. 2.

FIG. 2 is a top planar view illustrating a portion of a first wafer 111, wherein a first bonding means 112, a second bonding means 113, and electric interconnection means 114 are formed according to an exemplary embodiment. FIG. 3 is a cross-sectional view according to the cut across line 115 in FIG. 2.

FIG. 2 and FIG. 3 show a first bonding means 112, a second bonding means 113, and electrical interconnection means 114 that are disposed on the bonding surface 105 of the first wafer 111. The bonding means and electrical interconnection means may have a form of pad or pads having a finite thickness and area, but are not limited thereto. The first bonding means 112 and the second bonding means 113 are disposed in a peripheral area outside the interconnection means 114 (e.g., contact pads) within a die boundary 116 of each of dies 117 with a closed form that surrounds the electrical interconnection means 114. The shape and number of bonding means are not limited but can be provided as desired. The electrical interconnection means 114 are preferably disposed on electrical contact pads of each of the dies 117.

The first bonding means 112 may comprise metal or solder films that can provide a direct bonding or diffusion bonding at temperatures below 200° C., or more preferably at room temperature. More precisely, the first bonding means 112 can comprise multi-layered metal films consisting of at least two layers and the outermost layer comprises Au, Cu, Al, Au/Sn, Sn, In, or Sn-alloy. The first bonding means 112 may be provided by evaporation, plating, chemical vapor deposition, sputtering, etc., commonly used for ordinary IC and MEMS fabrication.

The second bonding means 113 may comprise metal or solder films commonly used for conventional wafer bonding methods such as eutectic bonding, solder bonding, thereto-compression bonding, and diffusion bonding. More precisely, the second bonding means 113 may comprise multi-layered metal films having at least two layers and the outermost layer preferably comprises Au, Cu, Al, Au/Sn, Sn, or Sn-alloy. In addition, the first bonding means 112 and the second bonding means 113 may also be provided as a hermetic sealing means that protects the devices and contact pads in each die from external environment. The first bonding means 112 and the second bonding means 113 may comprise the same materials, and also either one means can be skipped.

The electrical interconnection means 114 may comprise a stack of electrically conductive films, and the outermost layer preferably comprises Au, Cu, Al, Au/Sn, Sn, or Sn-alloy. More preferably, the electrical interconnection means may comprise the same materials with the first and/or second bonding means so as to simplify the manufacturing process when the bonding means comprises conductive materials. The electrical interconnection means 114 may be provided by using the methods commonly used for ordinary IC and MEMS fabrication, such as plating, evaporation, sputtering, etc. The first bonding means 112, the second bonding means 113, and the electrical interconnection means 114 may be provided irrespective of order.

Figure 4:
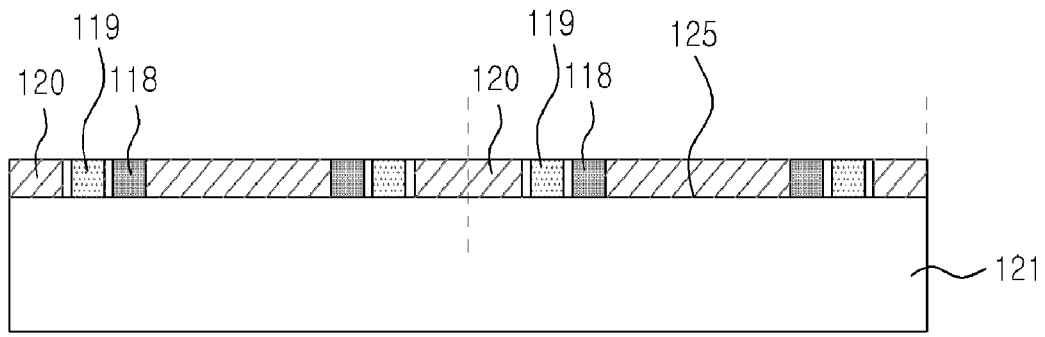
FIG. 4 is a cross-sectional view of a first wafer according to an exemplary embodiment of the method, wherein a first bonding means comprises adhesive materials.

FIG. 4 is a cross-sectional view of a first wafer 121 according to an exemplary embodiment of the method, wherein the first bonding means 120 comprises adhesive materials. Adhesive materials such as polymer or epoxy may be used for the first bonding means 120. The first bonding means 120 may be disposed on the entire bonding surface 125 except the place where the second bonding means 119 and the electrical interconnection means 118 are disposed thereon. The second bonding means 119 and the electrical interconnection means 118 may be disposed in the same manner as described with reference to FIG. 2 and FIG. 3. The second bonding means 119 and the electrical interconnection means 118 may comprise the same materials and methods as the second bonding means 113 and the electrical interconnection means 114 described with reference to FIG. 2 and FIG. 3.

Figure 5:
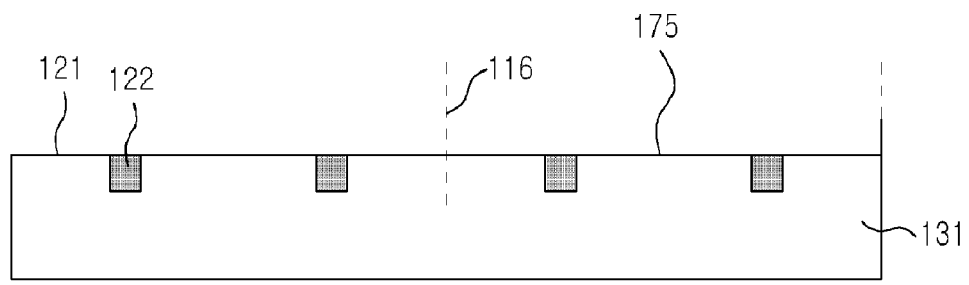
FIG. 5 is a cross-sectional view of a first wafer according to an exemplary embodiment of the method, wherein a first bonding means comprises bare or passivated bonding surface.

FIG. 5 is a cross-sectional view of a first wafer 131 according to an exemplary embodiment of the method, wherein a first bonding means comprises a bare or passivated bonding surface 175. A second bonding means may also be provided, but is preferably not provided. The electrical interconnection means 122 may be provided by the same materials and methods as the electrical interconnection means 114 described above with reference to FIG. 2 and FIG. 3. One modification from the previous case is that the electrical interconnection means 122 may be buried into the surface of the wafer to match the height with the bonding surface 175. For the fabrication of engineered substrates that comprise two un-processed wafers, electrical interconnection means 122 may also be skipped.

Figure 6:
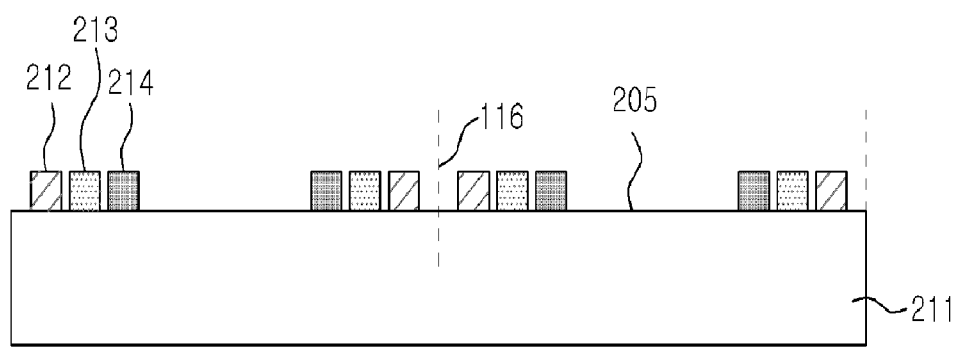
FIG. 6 is a cross-sectional view of a second wafer according to an exemplary embodiment comprising a first bonding means, a second bonding means, and electrical interconnection means corresponding to the first wafer of FIG. 2 and FIG. 3.

FIG. 6 is a cross-sectional view of a second wafer 211 according to an exemplary embodiment comprising a first bonding means 212, a second bonding means 213, and electrical interconnection means 214 corresponding to the first wafer of FIG. 2 and FIG. 3. FIG. 6 shows the second wafer 211 comprising the first bonding means 212, the second bonding means 213, and the electrical interconnection means 214 on the bonding surface 205 corresponding to the first wafer 111 as shown in FIG. 2 and FIG. 3. Other types of second wafers corresponding to the first wafers 121 and 131 shown in FIG. 4 and FIG. 5 may be provided by the same manner with the corresponding first wafers 121 and 131. Therefore, detailed descriptions for the preparation of second wafers corresponding to their respective first wafers are skipped herein. As an exception in the case of adhesive bonding, adhesive may be applied to only one wafer.

In the above descriptions, the differentiation of bonding means and electrical interconnections means may be apparent to one of ordinary skill in the art when the bonding means comprises non-conducting materials. However, when the bonding means comprises conducting materials, the differentiation may be imprecise. For an example, electrical interconnection means may comprise a bonding means on the peripheral area where electrical contact pads are not present, and in the same way, bonding means may comprise an electrical interconnection means on the electrical contact pads.

Figure 7:
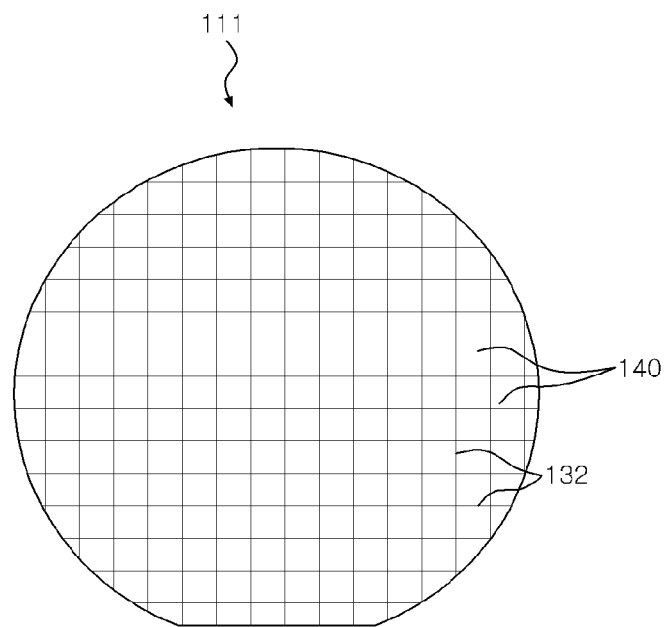
FIG. 7 is a top planar view illustrating a first wafer, wherein a plurality of grooves are formed in the bonding surface according to an exemplary embodiment.

FIG. 7 is a top planar view illustrating the first wafer 111, wherein a plurality of grooves are formed (after the step S120) in the bonding surface according to an exemplary embodiment. In the step S120, a plurality of grooves 132 may be formed along the boundaries of each of the dies across the entire bonding surface region in horizontal and vertical directions with a predetermined interval, so that the entire bonding surface region of the first wafer 111 is divided into a plurality of small segments 140 having an area defined by the grooves 132. The area of the segments 140 may be the same as a die (or chip) size of the first wafer 111, so that the grooves 132 may be centered on dicing lines between dies. When the die size of the first wafer 111 is small enough so that wafer bow and warp induced by thermal stress is negligible during the first bonding step, the area of the segments 140 may become larger than the die size, or more preferably an even multiple of the die size.

Figure 8:
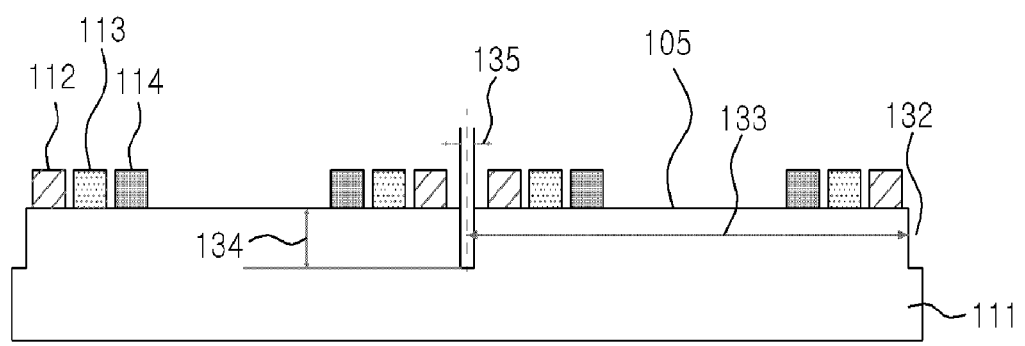
FIG. 8 is a cross-sectional view illustrating a portion of the first wafer of FIG. 7.

FIG. 8 is a cross-sectional view illustrating a portion of the first wafer 111 of FIG. 7. A plurality of grooves 132 are provided in the bonding surface of the first wafer 111 with an interval same with the die width 133. The grooves 132 may be formed by using at least one method selected from the group consisting of dry etching, laser drilling, sawing blade cutting, and wet etching. The depth 134 of the grooves 132 is at least not deeper than the thickness of the first wafer 111 and the width 135 of the grooves is equal or less than the width of a dicing line or kerf (not shown), thereby avoiding the separation of the first wafer 111 and valuable wafer area loss by the grooves 132.

A next step of the method 50 is a low-temperature bonding step S130 of the first wafer 111 (or 121 and 131) and the second wafer 211 (or corresponding second wafers). Object of the step S130 includes bonding the two wafers without arising thermal stress and simultaneously providing mechanical adhesion that can withstand subsequent back thinning step S140. To accomplish the object, room temperature bonding is most preferred, but embodiments are not limited to specific bonding methods and bonding temperatures as long as significant thermal stresses do not arise. Depending on the amount of TEC mismatch between the two wafers 111 and 211, low-temperature bonding techniques such as adhesive bonding and diffusion bonding also may be used.

Figure 9:
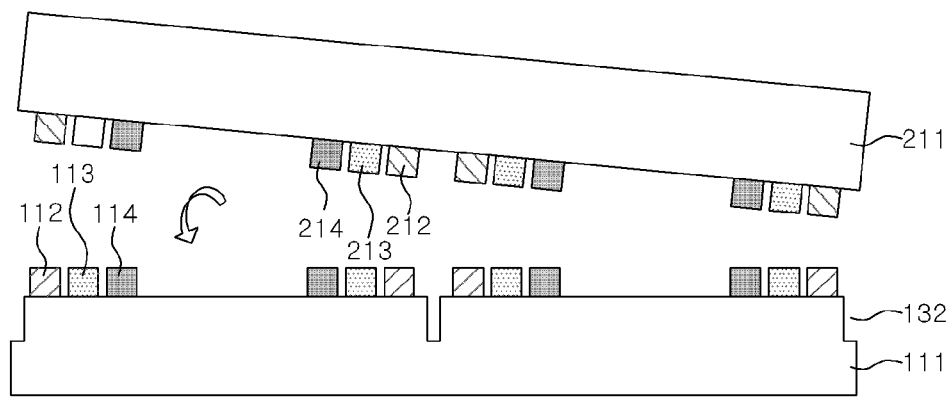
FIG. 9 is a cross-sectional view illustrating an example of a low-temperature wafer bonding process of the first wafer and the second wafer.
Figure 10:
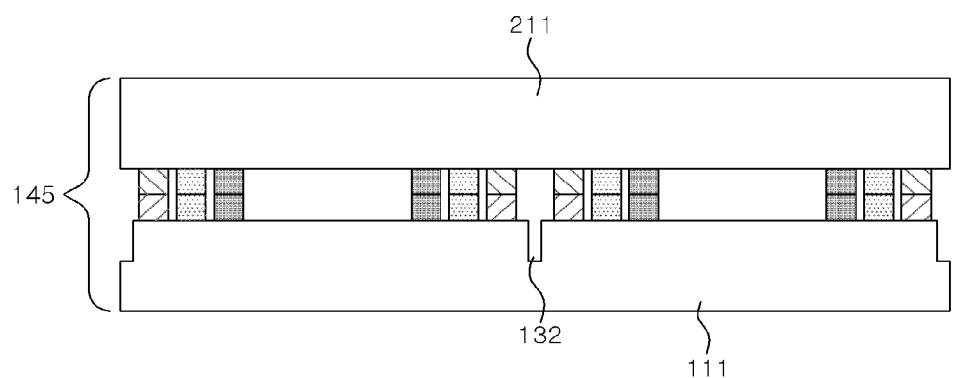
FIG. 10 is a cross-sectional view of a portion of a bonded wafer pair after completion of a low-temperature bonding step.

The method of the low-temperature bonding is directly related with the first bonding means provided in the step S110 and S210 as shown in FIG. 2 through FIG. 6. FIG. 9 is a cross-sectional view illustrating an example of a low-temperature wafer bonding process of the first wafer and the second wafer. In the method, the first bonding means 112 and 212, the second bonding means 113 and 213, and the electrical interconnection means 114 and 214 are provided at both of the first wafer 111 and the second wafer 211. Prior to wafer bonding, the first wafer 111 and the second wafer 211 are aligned by using proper wafer alignment tools. After aligning the two wafers 111 and 211, the wafers may be bonded by metal-to-metal room temperature direct bonding or by diffusion bonding. Between these methods, room-temperature direct bonding is more preferred to avoid arising thermal stress. The most popular room-temperature direct bonding technique available today is surface activated bonding (SAB). The SAB is possible between various materials such as semiconductor-semiconductor, metal-metal, metal-ceramic, and semiconductor-metal. For the direct bonding, a surface activation process using plasma in vacuum or atmospheric pressure may be further applied, and also a pressure can be further applied during the bonding process. FIG. 10 is a cross-sectional view of a portion of a bonded wafer pair 145 after completion of a low-temperature bonding step S130.

Adhesive bonding may be applied to the first wafer 121 as shown in FIG. 4 and the corresponding second wafer (not shown). Generally, adhesive bonding is performed at temperatures of from room temperature to about 350° C. In the present embodiment, less than 200° C. is preferred for a low-stress wafer bonding.

Another type of room temperature direct bonding method may be applied to the first wafer shown in FIG. 5 and the corresponding second wafer (not shown). In this case, a bare surface or a passivated surface of the two wafers becomes a bonding means. Depending on the substrate materials or surface finish, various combinations of direct bonding may be achieved, e.g., semiconductor-semiconductor, metal-ceramic, semiconductor-metal, etc. Prior to the bonding process, a surface activation step may be further applied, and also a pressure may be further applied during the bonding process.

Figure 11:
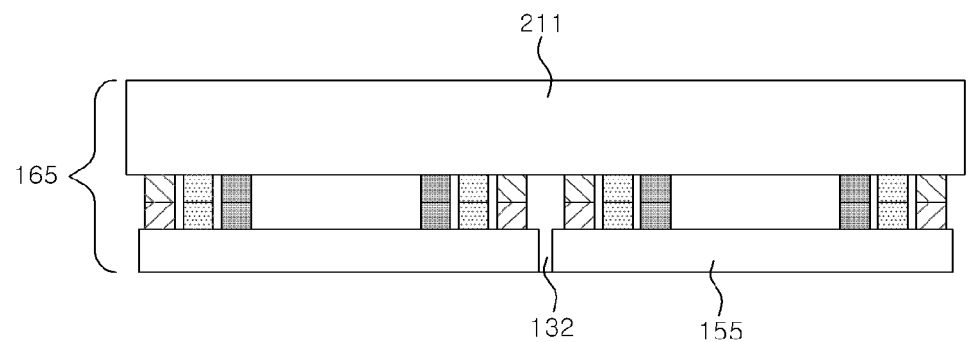
FIG. 11 is a cross-sectional view of a bonded wafer pair after the completion of a back side thinning step.

A next step of the method 50 is back side thinning step S140 to the bonded wafer pair 145 of FIG. 10. The methods of wafer thinning may comprise chemical mechanical polishing, chemical etching, separation by implantation of hydrogen, etc. FIG. 11 is a cross-sectional view of the bonded wafer pair 165 after the completion of the back side thinning step S140. As illustrated in FIG. 11, the back side of the first wafer 111 of FIG. 10 is removed such that at least a portion of the grooves 132 is exposed. After this step, the segments 140 of FIG. 7 are completely separated from each other by the grooves 132 while the bottom of the segments 155 still remains bonded to the second wafer 211.

The back side thinning process transforms the wafer-to-wafer bonded wafer pair 145 into a die-to-wafer bonded pair 165, therefore the method transforms a wafer-to-wafer bonding structure into a die-to-wafer bonding structure. A die-to-wafer bonding is more advantageous than the wafer-to-wafer bonding in at least several aspects. First, thermal stress is confined into a die size level because each of the dies and a host wafer are free to expand or contract in a lateral direction, therefore wafer scale bow and warp is substantially prevented. Second, the area of bond interface is very small compared to wafer-to-wafer bonded structure and gaps between the dies act as a stress buffer, therefore bending and cracking in the dies also can be reduced. Third, the combined effects of stress confinement and stress buffering can increase the bonding temperature further than that of the wafer-to-wafer bonded structure, so that a more strong and reliable bond can be achieved. Thereby embodiments may avoid wafer level bow and warp, and also may reduce cracking and debonding in die level during the high temperature wafer bonding of dissimilar wafers.

The final step of the method 50 is the rebonding step S150 of the die-to-wafer bonded pair 165. The rebonding may be achieved by two methods, a simple heat treatment to increase the first bonding strength or by the formation of a new bond between the first bonding means and/or the second bonding means. In both cases, the rebonding is performed at an elevated temperature of at least higher than the first bonding temperature.

When the first bonding is achieved by direct bonding or diffusion bonding, the rebonding step may be a simple heat treatment process at elevated temperatures. The methods of forming new bonds may include anodic bonding, diffusion bonding, eutectic bonding, and solder bonding depending on the second bonding means provided in the step S110 and S210. A pressure and/or voltage as well as heat can be further applied during the rebonding process. In the rebonding step, the bonding means and the electrical interconnection means in the first and second wafers may be all together incorporated in physical joining and electrical interconnections. Physical contacts between the electrical interconnection means that may be incomplete from the low-temperature bonding step may be further secured through the rebonding step S150. The maximum temperature for the rebonding step may be practically unlimited, but considering the limitations of heterogeneous wafer bonding below 400° C. is preferred.

Embodiments of the manufacturing method of a hetero-bonded wafer may further comprise: forming through-wafer vias; forming insulating layers on the side wall of the through-wafer vias; filling metals into the through-wafer vias and forming metal pads; and forming solder bumps, on at least one side of the hetero-bonded wafer pair.

Figure 12:
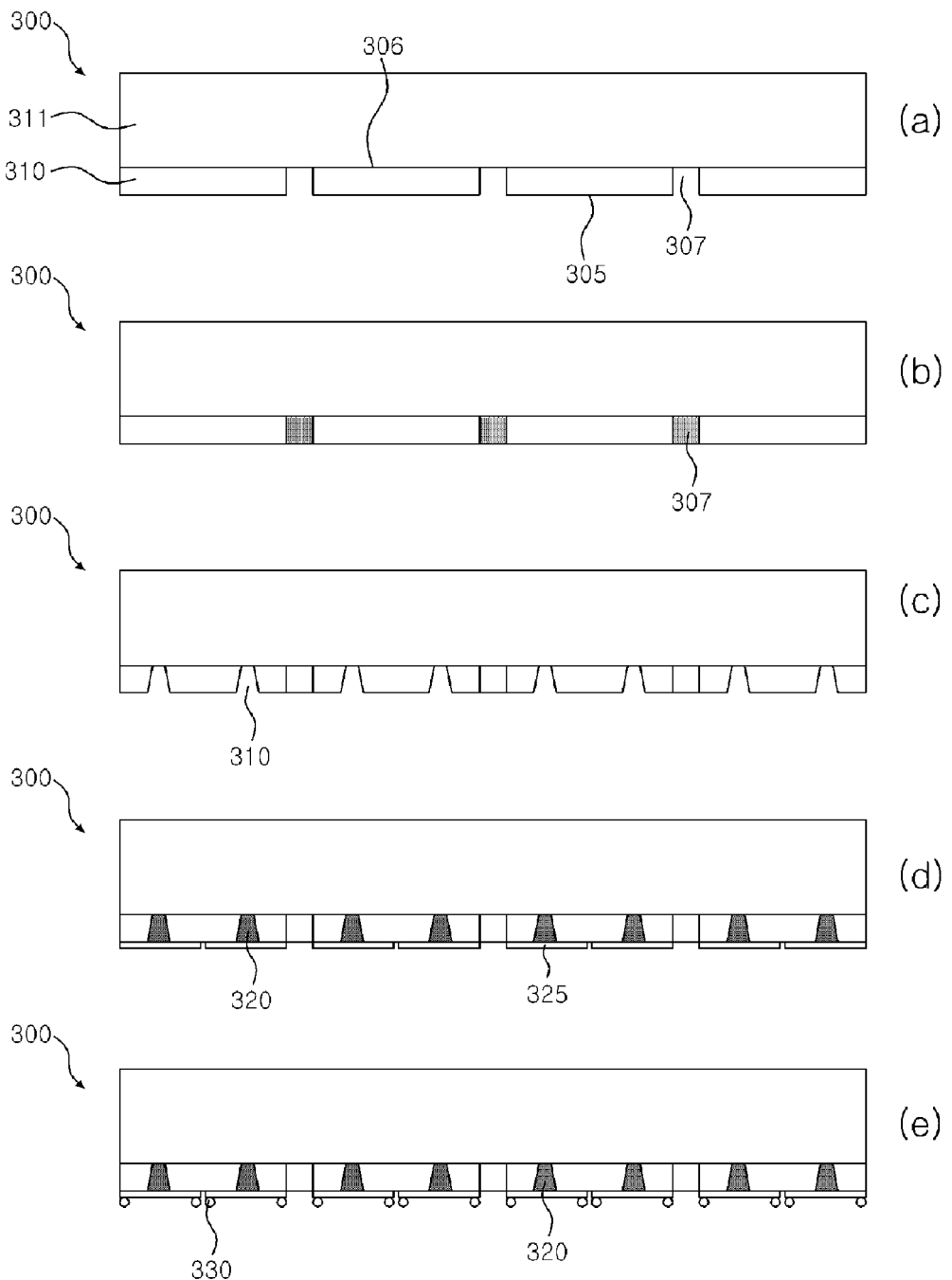
FIG. 12(*a*) to FIG. 12(*e*) are schematic cross-sectional views illustrating processing steps for providing through-wafer vias, metal pads, and solder bumps to a hetero-bonded wafer according to an exemplary embodiment.

FIG. 12(a) to FIG. 12(e) are schematic cross-sectional views illustrating processing steps for providing through-wafer vias, metal pads and solder bumps to a hetero-bonded wafer according to an exemplar embodiment. As illustrated, the through-wafer vias, metal pads and solder bumps are provided on the back side surface of a first wafer. FIG. 12(a) shows a bonded wafer pair 300, wherein a first wafer 310 and a second wafer 311 are bonded together, and the first wafer 310 is separated by the grooves 307 according to an exemplary embodiment. Referring to FIG. 12(b), photoresists or polymers may be filled into the grooves 307 from the back side surface 305 of the first wafer 310 and cured by heat treatment or by UV exposure. This step is for providing a planarized back side surface of the first wafer 310, and thereby facilitating subsequent processes. Referring to FIG. 12(c), through-wafer vias 320 reaching to electrical interconnection means on the bonding surface 306 of the first wafer 310 may be formed by standard semiconductor photolithography, and dry or wet etching process. Referring to FIG. 12(d), the through-wafer vias 320 are filled with conducting materials, e.g. Cu or Au metal, by electroplating, and electrical contact pads 325 may be formed by a sputtering and electroplating method after isolating the through-wafer vias 320 with proper dielectric films. Referring to FIG. 12(e), solder bumps 330 are formed to connect the bonded wafer pair 300 to external circuitry mechanically and electrically.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art. Descriptions of features or aspects within each embodiment should typically be considered as available for other similar features or aspects in other embodiments.

The invention may be described in terms of functional block components and various processing steps. Such functional blocks may be realized by any number of hardware and/or software components configured to perform the specified functions. For example, the invention may employ various integrated circuit components, e.g., memory elements, processing elements, logic elements, look-up tables, and the like, which may carry out a variety of functions under the control of one or more microprocessors or other control devices. Similarly, where the elements of the invention are implemented using software programming or software elements, the invention may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the invention could employ any number of conventional techniques for electronics configuration, signal processing and/or control, data processing and the like. The words "mechanism" and "element" are used broadly and are not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the terms "a" and "an" and "the" and similar referents in the context of describing the invention (especially in the context of the following claims) are to be construed to cover both the singular and the plural. It will be recognized that the terms "comprising," "including," and "having," as used herein, are specifically intended to be read as open-ended terms of art. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. Numerous modifications and adaptations will be readily apparent to those skilled in this art without departing from the spirit and scope of the invention.

What is claimed is:

1. A method for manufacturing a hetero-bonded wafer comprising:
   (a) providing a first wafer and a second wafer having substantially different thermal expansion coefficients from one another;
   (b) forming bonding means and electrical interconnection means on at least one bonding surface of the first wafer and the second wafer;
   (c) forming grooves having a depth shallower than a thickness of the first wafer in the bonding surface along dicing lines of the first wafer, thereby dividing the bonding surface of the first wafer into a plurality of small segments having a size defined by the grooves;
   (d) aligning and bonding the first wafer and the second wafer together as a bonded wafer pair at a first bonding temperature of less than 200° C. to avoid arising thermal stress while providing intermediate bonding of the bonded wafer pair;
   (e) thinning a back side of the bonded first wafer such that at least a portion of the grooves are exposed, thereby fragmenting the bonded first wafer into a plurality of small segments while the small segments remain bonded to the second wafer; and
   (f) rebonding the bonded wafer pair at an elevated temperature of at least greater than the first bonding temperature.

2. The method of manufacturing a hetero-bonded wafer according to claim 1, wherein a substrate of each of the first wafer and the second wafer comprises at least one selected from the group consisting of silicon, compound semiconductors, glass, ceramics, piezoelectric materials, or LTCC.

3. The method of manufacturing a hetero-bonded wafer according to claim 1, wherein at least one of the first wafer and the second wafer comprises a device wafer comprising therein at least one selected from the group consisting of electric devices, mechanical devices, optoelectronic devices, photonic devices, sensors, and bio devices.

4. The method of manufacturing a hetero-bonded wafer according to claim 3, wherein the device wafer comprises a stacked wafer comprising at least two wafers.

5. The method of manufacturing a hetero-bonded wafer according to claim 1, wherein at least one of the first wafer and the second wafer comprises an un-processed bare wafer.

6. The method of manufacturing a hetero-bonded wafer according to claim 1, wherein one of the first wafer and the second wafer comprises a device wafer and the other of the first wafer and the second wafer comprises a cap wafer for wafer level packaging of the device wafer by wafer bonding.

7. The method of manufacturing a hetero-bonded wafer according to claim 6, wherein the cap wafer further comprises at least one selected from the group consisting of cavities, through-wafer vias, bonding means, and passive devices.

8. The method of manufacturing a hetero-bonded wafer according to claim 1, wherein one of the first wafer and the second wafer comprises a SAW or FBAR device wafer and the other of the first wafer and the second wafer comprises a LTCC wafer for packaging the device wafer by wafer bonding.

9. The method of manufacturing a hetero-bonded wafer according to claim 1, wherein the bonding means comprises at least one selected from the group consisting of bare or passivated wafer surface, polymers, solder, and metals.

10. The method of manufacturing a hetero-bonded wafer according to claim 1, wherein the electrical interconnection means comprises an electrically conductive material.

11. The method of manufacturing a hetero-bonded wafer according to claim 1, wherein the electrical interconnection means comprises multi-layered metal films having at least two layers.

12. The method of manufacturing a hetero-bonded wafer according to claim 11, wherein an outermost layer of the electrical interconnection means comprises one selected from the group consisting of Au, Cu, Al, Au/Sn, Sn, and Sn-alloy.

13. The method of manufacturing a hetero-bonded wafer according to claim 1, wherein the bonding means and the electrical interconnection means each comprise a same conductive material.

14. The method of manufacturing a hetero-bonded wafer according to claim 1, wherein the step (d) of aligning and bonding the first wafer and the second wafer together uses a first bonding means and the step (f) of rebonding the bonded wafer pair uses a second bonding means.

15. The method of manufacturing a hetero-bonded wafer according to claim 14, wherein the first bonding means comprises a bare or passivated wafer surface and the second bonding means comprises a same material as the electrical interconnection means.

16. The method of manufacturing a hetero-bonded wafer according to claim 1, wherein step (d) of aligning and bonding the first wafer and the second wafer together comprises at least one selected from the group consisting of room temperature direct bonding, diffusion bonding, and adhesive bonding.

17. The method of manufacturing a hetero-bonded wafer according to claim 1, wherein step (f) of rebonding the bonded wafer pair comprises at least one selected from the group consisting of annealing, diffusion bonding, eutectic bonding, solder bonding, and anodic bonding.

18. The method of manufacturing a hetero-bonded wafer according to claim 1, wherein step (d) of aligning and bonding the first wafer and the second wafer together and step (f) of rebonding the bonded wafer pair both comprise applying pressure and voltage as well as heat.

19. The method of manufacturing a hetero-bonded wafer according to claim 1, wherein step (d) of aligning and bonding the first wafer and the second wafer together and step (f) of rebonding the bonded wafer pair both comprise applying pressure or voltage as well as heat.

20. The method of manufacturing a hetero-bonded wafer according to claim 1, wherein the area of the segments is the same as or an even multiple of a die size of the first wafer.

21. The method of manufacturing a hetero-bonded wafer according to claim 1, wherein a width of the grooves is smaller than a width of a dicing line or a dicing kerf of the first wafer.

22. The method of manufacturing a hetero-bonded wafer according to claim 1, further comprising:

forming through-wafer vias in at least one of the first wafer and the second wafer;

filling the through-wafer vias with metal and forming metal pads in conjunction with the through-wafer vias; and forming solder bumps on a back side of at least one wafer of the bonded wafer pair.

23. A method for manufacturing a hetero-bonded wafer comprising:
- (a) providing a first wafer and a second wafer having substantially different thermal expansion coefficients from one another;
- (b) forming bonding means comprising a bare or passivated wafer surface on at least one bonding surface of the first wafer and the second wafer;
- (c) forming grooves having a depth shallower than a thickness of the first wafer in the bonding surface along dicing lines of the first wafer, thereby dividing the bonding surface of the first wafer into a plurality of small segments having a size defined by the grooves;
- (d) aligning and bonding the first wafer and the second wafer together as a bonded wafer pair at a first bonding temperature of less than 200° C. to avoid arising thermal stress while providing intermediate bonding of the bonded wafer pair;
- (e) thinning a back side of the bonded first wafer such that at least a portion of the grooves are exposed, thereby fragmenting the bonded first wafer into a plurality of small segments while the small segments remain bonded to the second wafer; and
- (f) rebonding the bonded wafer pair at an elevated temperature of at least greater than the first bonding temperature.

* * * * *